United States Patent
Holman

(10) Patent No.: US 11,689,169 B1
(45) Date of Patent: Jun. 27, 2023

(54) LINKING AUDIO AMPLIFICATION GAIN REDUCTION PER CHANNEL AND ACROSS FREQUENCY RANGES

(71) Applicant: Apple Inc., Cupertino, CA (US)

(72) Inventor: Tomlinson Holman, Palm Springs, CA (US)

(73) Assignee: Apple Inc., Cupertino, CA (US)

( * ) Notice: Subject to any disclaimer, the term of this patent is extended or adjusted under 35 U.S.C. 154(b) by 219 days.

(21) Appl. No.: 17/319,859

(22) Filed: May 13, 2021

Related U.S. Application Data

(60) Provisional application No. 63/154,452, filed on Feb. 26, 2021.

(51) Int. Cl.
| | | |
|---|---|---|
| H03G 3/30 | (2006.01) | |
| H03G 7/00 | (2006.01) | |
| H03G 9/02 | (2006.01) | |
| H03F 3/68 | (2006.01) | |
| H03F 1/52 | (2006.01) | |

(52) U.S. Cl.
CPC ............ *H03G 3/301* (2013.01); *H03F 1/523* (2013.01); *H03F 3/68* (2013.01); *H03G 7/00* (2013.01); *H03G 9/025* (2013.01)

(58) Field of Classification Search
CPC .......... H03G 3/301; H03G 7/00; H03G 9/025; H03F 1/523; H03F 3/68
See application file for complete search history.

(56) References Cited

U.S. PATENT DOCUMENTS

| | | | | |
|---|---|---|---|---|
| 4,583,245 A * | 4/1986 | Gelow | ..................... | H04R 3/14 |
| | | | | 381/100 |
| 4,887,298 A * | 12/1989 | Haigler | .................. | H03G 3/341 |
| | | | | 381/59 |
| 6,760,452 B2 | 7/2004 | Lau et al. | | |
| 2002/0090096 A1 * | 7/2002 | Blind | ....................... | H03G 7/06 |
| | | | | 381/104 |
| 2002/0150266 A1 * | 10/2002 | Hinkle | .................... | H03G 7/007 |
| | | | | 381/104 |
| 2007/0005160 A1 * | 1/2007 | Zaucha | .................. | H03G 3/341 |
| | | | | 700/94 |
| 2015/0063600 A1 * | 3/2015 | Kono | ..................... | H03G 9/005 |
| | | | | 381/107 |
| 2016/0105742 A1 * | 4/2016 | Gautama | .................. | H03G 3/20 |
| | | | | 381/103 |
| 2016/0322949 A1 * | 11/2016 | Gautama | .................. | H04R 3/04 |

(Continued)

FOREIGN PATENT DOCUMENTS

JP 2019096947 A * 6/2019

OTHER PUBLICATIONS

LaMacchia, Brewster, "Sigma DSP for active speaker systems—application note," Momentum Data Systems, Aug. 19, 2016, 25 pages.

(Continued)

*Primary Examiner* — David L Ton
(74) *Attorney, Agent, or Firm* — Aikin & Gallant, LLP

(57) ABSTRACT

A method for reducing gain for audio amplification by an audio system having a tweeter channel, an optional mid-range channel, and a woofer channel. Gain of the woofer channel is reduced simultaneously with reducing gain of the tweeter channel, both responsive to detecting the same instance of overloading (overdriving) the woofer channel. Other aspects are also described and claimed.

20 Claims, 3 Drawing Sheets

(56) References Cited

U.S. PATENT DOCUMENTS

2019/0132677 A1* 5/2019 Kurosaki .............. H04R 3/007
2019/0200122 A1* 6/2019 Lambert .............. H04R 29/001
2019/0200146 A1* 6/2019 Button .................... H04R 3/04

OTHER PUBLICATIONS

"Advent Powered Loudspeakers—Need Help," diyAudio, Jan. 6, 2004, 4 pages.
"Advent Powered Loudspeaker," PALS.gif, retrieved from the Internet <www.fisherdoctor.com/PALS.gif>, Jan. 6, 2004, 1 page.
"Typical Voltage Readings for APLS," Audio Service Bulletin 80-5, Subj: APLS Voltage Readings, Aug. 1980, 1 page.
"Schematic Rev. Information for Latest APLS Control Panel," Audio Service Bulletin 80-4, Subj: A.P.L.S. Schematic Revision, Aug. 1980, 1 page.

* cited by examiner

LINKING AUDIO AMPLIFICATION GAIN REDUCTION PER CHANNEL AND ACROSS FREQUENCY RANGES

This nonprovisional patent application claims the benefit of the earlier filing date of U.S. provisional application no. 63/154,452 filed Feb. 26, 2021.

FIELD

This disclosure generally relates to electronic audio systems, and more particularly to electronic signal processing techniques for controlling audio amplification of speaker driver input signals aimed at improving perceived quality of the reproduced sound.

BACKGROUND

It is commonplace today to employ powered loudspeakers that consist of two-way driver systems (woofer and tweeter) or three-way driver systems (woofer, midrange and tweeter). Active crossovers separate an input, full frequency range audio signal into two or three sub-band signals (bass, midrange, and treble), before being passed to respective power amplifiers (whose outputs feed the respective speaker drivers.) This increases headroom, which may be defined as how much power a power amplifier can produce before its output signal starts to become a distorted version of its input. That is because the bass sub-band signal is restricted from driving the treble or midrange power amplifiers into clipping overload. Thus, on common user sound program material, the handling of loud playback is improved.

Nevertheless, clipping overloads can still occur, in which case a power amplifier channel will undesirably produce harmonic and in-harmonic components. Such spectral components may be heard by a listener, because they are not masked by the fundamental signal (which is causing the overload). For this reason, it is typical to use a limiter just before or within each of the power amplifiers. The limiters are operated as follows in a stereo or multichannel system: if one woofer channel is being limited, then another woofer channel is also limited simultaneously even if it is not yet clipping; a similar process is performed across two or more tweeter channels. This conventional limiting approach of linking woofer channels to each other, and tweeter channels to each other, may help avoid shifting the sound image that is being reproduced by the system as a whole.

SUMMARY

When the limiter of a woofer amplifier is in gain reduction mode (because its input signal is too high), it reduces the gain that is applied to its channel input signal in order to prevent clipping of the amplifier. An unfortunate side effect of this is that while the woofer output level is being reduced, the tweeter and if present a midrange of such a system may not be near clipping, and hence are not automatically limited. Thus, the spectral balance of such a system (during loud playback) is tilted towards the upper frequencies, and as a result the reproduced sound becomes shrill.

One aspect of the disclosure here is a method for reducing gain for audio amplification during playback by an audio system. The system has a woofer channel and a midrange or tweeter channel (or both). Gain in the woofer channel is automatically reduced in order to avoid distortion that would be due to overloading (overdriving) of the woofer channel, while the perceived sound quality is maintained by also reducing gain of the tweeter channel or the midrange channel responsive to the same detected instance of overloading the woofer channel. As a result, the reproduced woofer sound is not distorted and the overall sound is not shrill thereby yielding an improved listening experience.

Another aspect of the disclosure here is the following method for reducing gain for audio amplification during playback by an audio system. The system has a first sub-band audio channel and a second sub-band audio channel. Gain in the second sub-band channel is automatically reduced in order to avoid distortion that would be due to overloading (overdriving) of the second sub-band channel, while the perceived sound quality is maintained by also reducing gain of the first sub-band channel responsive to the same detected instance of overloading the second sub-band channel.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Figure 1:
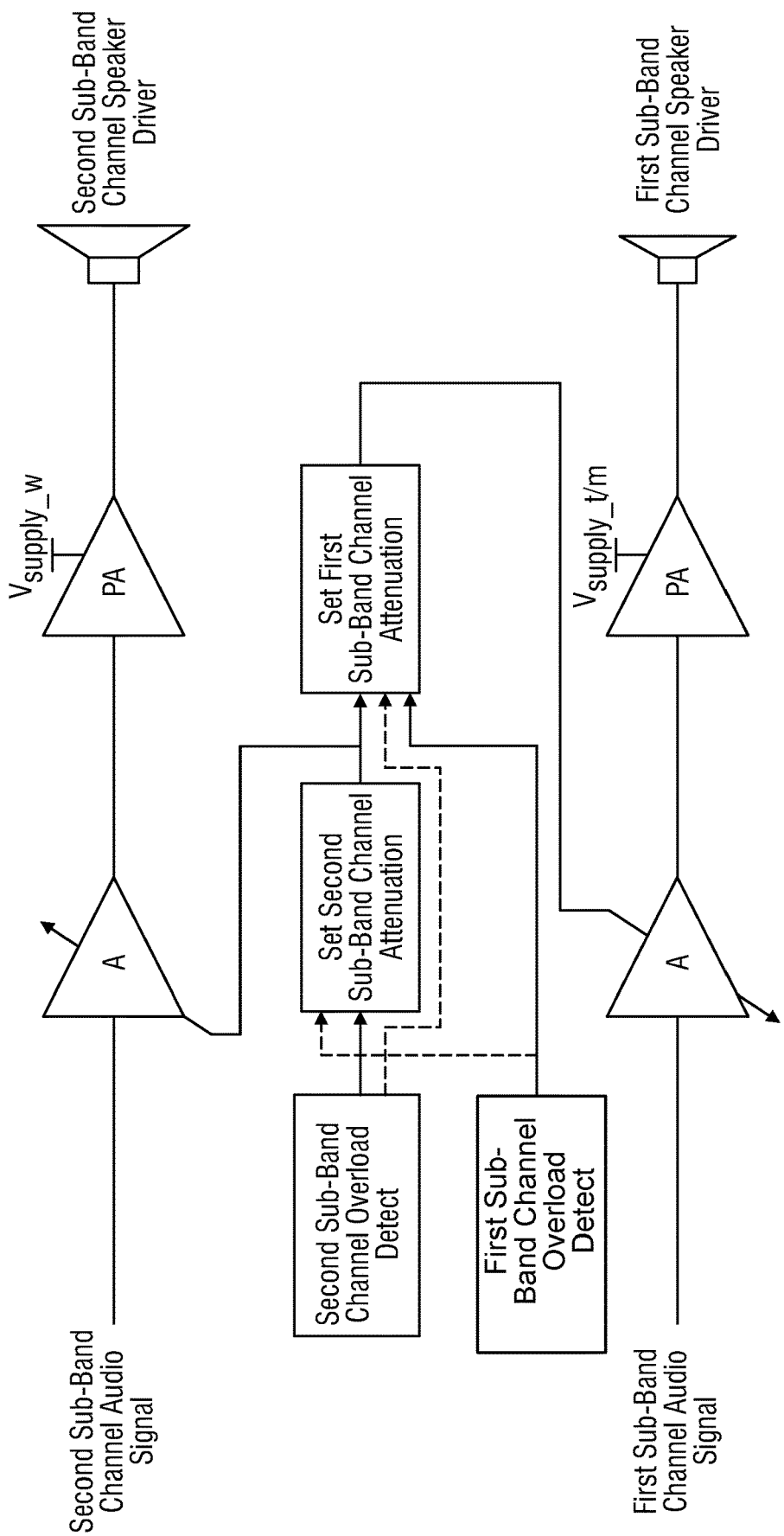
FIG. 1 shows a block diagram of an audio amplification system.

FIG. 1 shows a block diagram of an audio amplification system during playback of an input sound program. The system has at least two audio channels, a first sub-band audio channel and a second sub-band audio channel. The term "sub-band" refers to a portion of a signal that covers a range of frequencies that is smaller than or a subset of the full frequency range of the signal. Gain in the second sub-band channel is automatically reduced in order to avoid distortion that would be due to overloading (overdriving) of the second sub-band channel, while the perceived sound quality is maintained by also reducing gain of the first sub-band channel responsive to the same detected instance of overloading the second sub-band channel.

In one aspect, the second sub-band audio channel feeds a low frequency speaker driver, e.g., a woofer speaker driver (woofer), while the first sub-band audio channel feeds a high frequency speaker driver, e.g., a tweeter speaker driver or a midrange speaker driver (tweeter or midrange). The terms "low frequency" and "high frequency" may be defined relative to each other, where the upper end of a low frequency band may or may not overlap with the lower end of a high frequency band but a majority of the low frequency band does not overlap with the high frequency band, and a majority of the of the high frequency band does not overlap with the low frequency band. A low frequency speaker driver is one that is intended to primarily "work" or specialize in a low frequency band, like a woofer, while a high frequency driver is one that is intended to primarily work or specialize in a high frequency band, like a tweeter or midrange. An audio channel as defined here includes an analog or digital sub-band audio signal that represents the input sound program, and that is fed to a power amplifier (PA) that is driving the speaker driver for that channel. Thus, in the example shown, the woofer may be fed an amplified version of a bass signal, while the tweeter/midrange is fed an amplified version of a treble/midrange signal. As an example, the woofer channel may be defined as having a −3 dB bandwidth that lies within the frequency range of 150 Hz to 2 kHz, while the −3 dB bandwidth of the tweeter/midrange channel lies in a frequency range that is above 2 kHz. In another example, the −3 dB bandwidth of the woofer channel lies somewhere in the range 20 Hz to 400 Hz, that of a midrange channel lines in the range 400 Hz to 1.6 kHz, and that of a tweeter channel lines above 1.6 kHz. In one example, the woofer and tweeter/midrange speaker drivers may be physically designed to be different in order to operate better in those low and high frequency bands, respectively.

Note that there may be additional audio channels in the system that are participating in the playback, e.g., one that feeds another low frequency speaker driver (second woofer) and one that feeds another high frequency driver (second tweeter or midrange).

The input sound program may be for example, a music file, a movie sound track, streaming live audio, or any other audio content. The bass and tweeter/midrange signals of the input sound program may have been previously encoded and decoded and then rendered for playback, according to any suitable digital audio codec and sound rendering techniques.

Each audio channel also contains an adjustable gain stage, A, upstream of the power amplifier (PA), as shown. During playback of the sound program, these separate gains are applied to the sub-band audio signals in their respective channels and are adjusted in real-time as follows. In a digital implementation, the system has a processor and memory having stored therein instructions that configure the processor to apply and adjust the gains in the digital domain (which are being applied to digital sub-band audio signals). In one aspect, the programmed processor detects that the second sub-band channel is being overloaded (e.g., clipping or, equivalently, near clipping) and in response i) reduces the second sub-band channel gain by a first amount that just avoids the overloading in the second sub-band channel, and ii) concurrently reduces the first sub-band channel gain by a second amount that is based on the first amount. The second sub-band channel gain reduction (attenuation) may be performed by a set second sub-band channel attenuation block.

Figure 3:
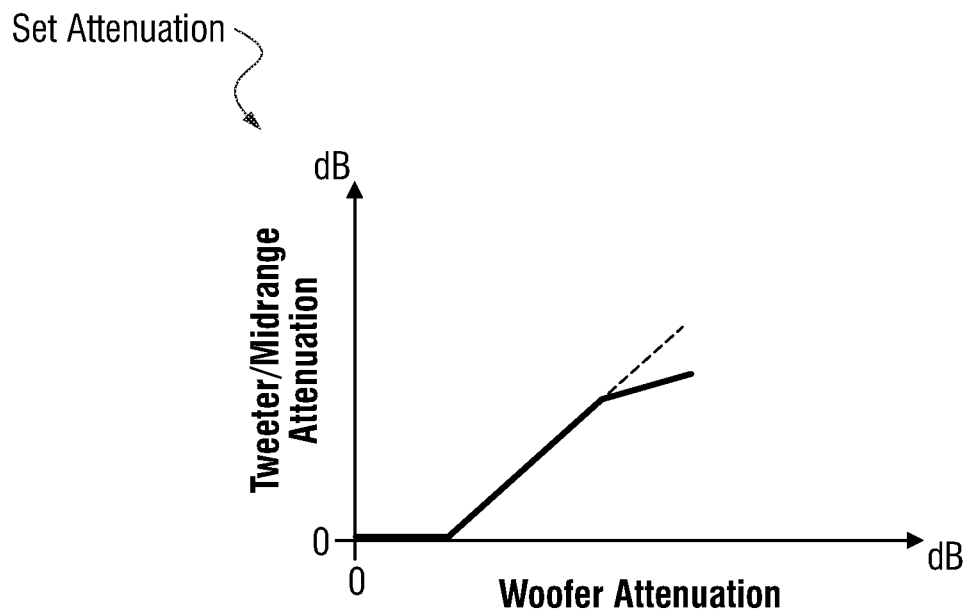
FIG. 3 is an example relationship for obtaining tweeter or midrange attenuation triggered by overload in a woofer channel and woofer attenuation, for a set attenuation block used in the system.

In addition to setting the gain reduction that is applied to the second sub-band channel, the set second sub-band channel attenuation block may control or influence a set first sub-band channel attenuation block. The latter sets how much the gain in the first sub-band channel is reduced, based not only upon an overload detection for its own channel but also how much the second sub-band channel gain is being reduced. As an example, the relationship between tweeter/midrange attenuation and woofer attenuation may be as illustrated for example in FIG. 3. In that example, the gain of the tweeter/midrange channel is not reduced unless gain of the woofer channel is being reduced by at least a threshold amount, e.g., 6 dB. Thereafter, the gain reduction may be 1:1 (as shown by the 1:1 slope) until another woofer attenuation threshold is reached beyond which the tweeter/midrange attenuation is less than the woofer attention, e.g., at a ratio of 0.5:1. In other words, when the slope is smaller than 1:1, the gain of the woofer channel is being reduced more than then gain of the tweeter or midrange channel. It should be noted here that the attenuation (gain reduction) that is set for either channel may be done as a limiting operation (abrupt) or it may be done as a compression operation (gradual).

Figure 4:
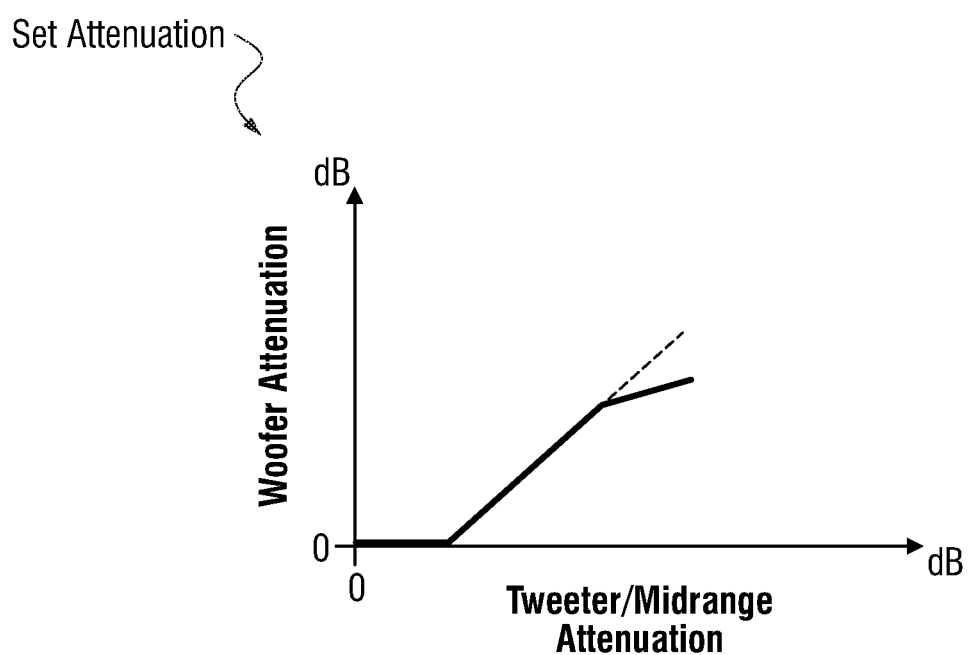
FIG. 4 is an example relationship for obtaining woofer attenuation triggered by overload in a tweeter or midrange channel and tweeter/midrange attenuation, for a set attenuation block used in the system.

FIG. 4 shows an example of a relationship that applies to a version of FIG. 1 where the second sub-band audio channel feeds a high frequency speaker driver, e.g., a tweeter or midrange speaker driver, and is to be attenuated as a real-time function of overloading in the first sub-band audio channel while the latter now feeds a low frequency speaker driver, e.g., a woofer speaker driver. The depicted relationship has an overall shape that is similar to the one in FIG. 3, although it could alternatively have a different shape.

Figure 2:
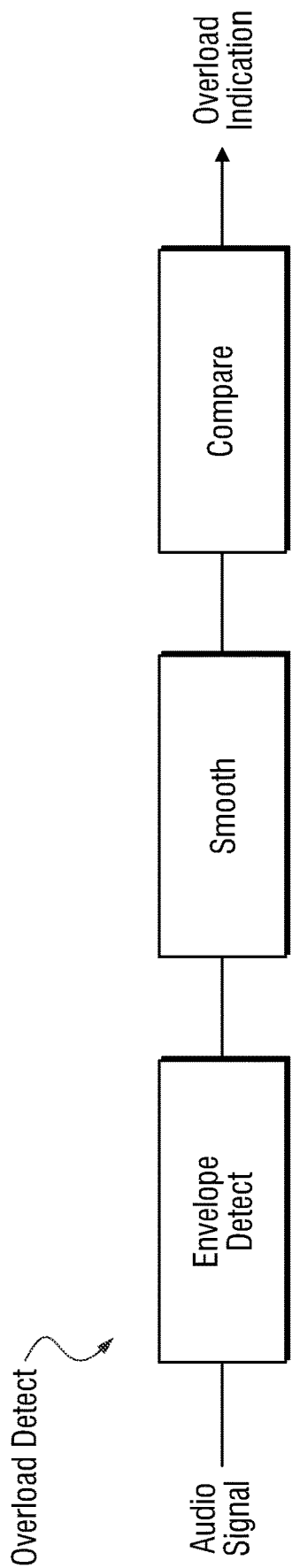
FIG. 2 is a block diagram of an example overload detect block used in the system.

With respect to overload detection, that operation may be performed in various ways. FIG. 2 shows one example where the audio signal (woofer or tweeter/midrange, depending on the channel that is being monitored for overload) is fed to an envelope detector before being smoothed and then compared to a threshold, resulting in an overload indication. In the analog domain, envelope detection may be performed using for example a full wave rectifier while the smoothing may be performed by an RC filter. The overload indication may be binary, or it may be more granular, e.g., indicating how much the threshold is being exceeded. The overload indication is then used by a set attenuation block in deciding how much to reduce the gain of a given sub-band channel. Here it should be noted that the overload detect blocks can be configured to detect overload based on an amplifier output load signal from their respective power amplifier, in addition or as an alternative to processing their input audio signal.

Equivalents to an all-digital implementation of the above described processes include a mixed-signal implementation where for example the gains are applied in analog domain while the overload detection and decision on the attenuation amount is in digital domain, and an all analog implementation where all of those operations are performed in analog domain.

Returning to FIG. 1, this diagram may be used to also illustrate the following more generic method of reducing gain for audio amplification. In such a method, and as described above, the gain of the second sub-band channel is reduced responsive to detecting an instance (in time) of overloading the second sub-band channel. Additionally, gain of the first sub-band channel is also being reduced, responsive to detecting the same instance of overloading the second sub-band channel. The first sub-band channel gain reduction may, as described above, be based directly on the second sub-band channel attenuation (which is being set to avoid second sub-band channel overload). FIG. 1 however also depicts an alternative, in dotted lines, where the set first sub-band channel attenuation block is configured to be responsive directly to the indication of second sub-band channel overload. In the case where the first sub-band channel is a tweeter or midrange channel and the second sub-band channel is a woofer channel, the overall relationship between the woofer attenuation and the tweeter/midrange attenuation could be as described above, e.g., in accordance with FIG. 3.

In another aspect of the disclosure here, in addition to the one-way cross coupling that was described above in connection with FIG. 1, which links overload in the second sub-band channel to attenuation in the first sub-band channel, a two-way cross coupling can be performed as follows. An instance of overloading in the first sub-band channel is detected in response to which gain of the first sub-band channel is reduced. Contemporaneously, gain of the second sub-band channel is reduced, responsive to detecting the same instance of overloading in the first sub-band channel.

While certain aspects have been described above and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. For example, although FIG. 1 shows a single first sub-band channel, there may be another first sub-band channel in the audio system (that is being used for playback of the same sound program) and in which a further adjustable gain, A, is being applied to another first sub-band audio signal of that channel. In such a case, the process described above could reduce the gain in the additional first sub-band channel by the same amount that was done for the initial first sub-band channel (responsive to the same instance of a second sub-band channel overload). The description is thus to be regarded as illustrative instead of limiting.

What is claimed is:

1. A method for reducing gain for audio amplification by an audio system having a first sub-band channel, and a second sub-band channel, the method comprising:
   reducing gain of the second sub-band channel responsive to detecting an instance of overloading the second sub-band channel; and
   reducing gain of the first sub-band channel responsive to detecting the instance of overloading the second sub-band channel.

2. The method of claim 1 wherein the second sub-band channel is a woofer channel that comprises an analog or digital bass signal of an input sound program, fed to a power amplifier that is driving a woofer speaker driver, and the first sub-band channel is a tweeter channel that comprises an analog or digital treble signal of an input sound program, fed to a power amplifier that is driving a tweeter speaker driver.

3. The method of claim 1 wherein −3 dB bandwidth of the second sub-band channel lies within 50 Hz to 2 kHz.

4. The method of claim 1 wherein −3 dB bandwidth of the first sub-band channel lies above 1.6 kHz or −3 dB bandwidth of the first sub-band channel lies above 2 kHz.

5. The method of claim 1 wherein the first sub-band channel is a tweeter channel that comprises an analog or digital treble signal of the input sound program, fed to another power amplifier that is driving a tweeter speaker driver.

6. The method of claim 1 wherein the audio system has a third sub-band channel being a midrange channel that comprises an analog or digital midrange signal of the input sound program, fed to another power amplifier that is driving a midrange speaker driver.

7. The method of claim 1 wherein reducing gain comprises limiting.

8. The method of claim 1 wherein reducing gain comprises compressing.

9. The method of claim 1 further comprising
   reducing gain of the first sub-band channel responsive to detecting an instance of overloading the first sub-band channel; and
   reducing gain of the second sub-band channel responsive to detecting the instance of overloading the first sub-band channel.

10. The method of claim 1 wherein detecting an instance of overloading the second sub-band channel comprises detecting clipping of a power amplifier that is driving a speaker driver.

11. The method of claim 1 wherein gain of the first sub-band channel is not reduced unless gain of the second sub-band channel is reduced by at least 6 dB.

12. The method of claim 1 wherein a ratio of first sub-band channel gain reduction to second sub-band channel gain reduction is 1:1 or smaller.

13. The method of claim 12 wherein gain of the second sub-band channel is reduced more than gain of the first sub-band channel.

14. The method of claim 12 wherein detecting an instance of overloading the second sub-band channel comprises detecting clipping in the second sub-band channel.

15. An audio system comprising:
   a first audio channel feeding a low frequency speaker driver;
   a second audio channel feeding a high frequency speaker driver;
   a processor; and
   memory having stored therein instructions that configure the processor to
      apply a first gain to the first audio channel;
      apply a second gain to the second audio channel; and
      detect that the first audio channel is being overloaded and in response i) reduce the first gain by a first amount and ii) contemporaneously reduce the second gain by a second amount that is based on the first amount.

16. The system of claim 15 wherein the low frequency speaker driver is a woofer speaker driver and the high frequency speaker driver is a tweeter speaker driver or a midrange speaker driver.

17. The system of claim 15 further comprising
   a third audio channel feeding another high frequency speaker driver,
   wherein the memory has stored therein further instructions that configure the processor to
      apply a third gain to the third audio channel,
      detect that the second audio channel is overloading and in response reduce the second gain and the third gain by a same amount.

18. The system of claim 15 wherein −3 dB bandwidth of the first audio channel lies within 150 Hz to 2 kHz.

19. The system of claim 18 wherein −3 dB bandwidth of the second audio channel lies above 2 kHz.

20. The system of claim 15 wherein reducing gain comprises limiting.

\* \* \* \* \*